(12) United States Patent
Iwane et al.

(10) Patent No.: US 9,948,877 B2
(45) Date of Patent: Apr. 17, 2018

(54) SOLID-STATE IMAGING APPARATUS AND IMAGING SYSTEM HAVING FIRST AND SECOND METAL MEMBERS ARRANGED IN DIFFERENT DIRECTIONS

(71) Applicant: CANON KABUSHIKI KAISHA, Tokyo (JP)

(72) Inventors: Masaaki Iwane, Sagamihara (JP); Akira Okita, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 105 days.

(21) Appl. No.: 14/818,560

(22) Filed: Aug. 5, 2015

(65) Prior Publication Data
US 2016/0057372 A1    Feb. 25, 2016

(30) Foreign Application Priority Data

Aug. 20, 2014    (JP) ................. 2014-167227

(51) Int. Cl.
*H04N 5/225* (2006.01)
*H04N 5/3745* (2011.01)
*H01L 27/146* (2006.01)
*H04N 5/378* (2011.01)

(52) U.S. Cl.
CPC ... *H04N 5/37457* (2013.01); *H01L 27/14609* (2013.01); *H01L 27/14636* (2013.01); *H01L 27/14641* (2013.01); *H04N 5/378* (2013.01); *H01L 27/14643* (2013.01)

(58) Field of Classification Search
CPC .................. H01L 27/146–27/14893
See application file for complete search history.

(56) References Cited

U.S. PATENT DOCUMENTS

| 6,534,336 B1 | 3/2003 | Iwane et al. |
| 7,187,052 B2 | 3/2007 | Okita et al. |
| 7,283,305 B2 | 10/2007 | Okita et al. |

(Continued)

FOREIGN PATENT DOCUMENTS

| JP | 2001-78093 | 3/2001 |
| JP | 2005-304077 | 10/2005 |
| JP | 2011-205230 | 10/2011 |

OTHER PUBLICATIONS

U.S. Appl. No. 14/834,860, Yoshiaki Takada, filed Aug. 25, 2015.

(Continued)

*Primary Examiner* — Twyler L Haskins
*Assistant Examiner* — Dwight Alex C Tejano
(74) *Attorney, Agent, or Firm* — Fitzpatrick, Cella, Harper & Scinto (57) ABSTRACT

Provided is a solid-state imaging apparatus, including: a first amplifier and a second amplifier; a coupling capacitor including a first electrode and a second electrode; a first metal member configured to connect an output terminal of the first amplifier and the first electrode; and a second metal member configured to connect an input terminal of the second amplifier and the second electrode, wherein, in a cross section perpendicular to a line that runs from the second electrode toward the input terminal of the second amplifier, the first metal member is arranged in at least two directions out of directions relative to the second metal member that are above, below, to the left of, and to the right of the second metal member.

21 Claims, 9 Drawing Sheets

(56) References Cited

U.S. PATENT DOCUMENTS

| | | |
|---|---|---|
| 7,294,818 B2 | 11/2007 | Matsuda et al. |
| 7,321,110 B2 | 1/2008 | Okita et al. |
| 7,408,210 B2 | 8/2008 | Ogura et al. |
| 7,456,880 B2 | 11/2008 | Okita et al. |
| 7,460,162 B2 | 12/2008 | Koizumi et al. |
| 7,466,003 B2 | 12/2008 | Ueno et al. |
| 7,514,732 B2 | 4/2009 | Okita et al. |
| 7,538,804 B2 | 5/2009 | Okita et al. |
| 7,538,810 B2 | 5/2009 | Koizumi et al. |
| 7,550,793 B2 | 6/2009 | Itano et al. |
| 7,557,847 B2 | 7/2009 | Okita et al. |
| 7,872,286 B2 | 1/2011 | Okita et al. |
| 7,935,995 B2 | 5/2011 | Watanabe et al. |
| 8,009,213 B2 | 8/2011 | Okita et al. |
| 8,106,955 B2 | 1/2012 | Okita et al. |
| 8,111,311 B2 | 2/2012 | Iwane |
| 8,139,133 B2 | 3/2012 | Iwane et al. |
| 8,158,920 B2 | 4/2012 | Suzuki et al. |
| 8,159,573 B2 | 4/2012 | Suzuki et al. |
| 8,199,235 B2 | 6/2012 | Okita et al. |
| 8,278,613 B2 | 10/2012 | Okita et al. |
| 8,325,260 B2 | 12/2012 | Yamazaki et al. |
| 8,345,137 B2 | 1/2013 | Shinohara et al. |
| 8,368,577 B2 | 2/2013 | Aruga |
| 8,525,896 B2 | 9/2013 | Okita et al. |
| 8,749,683 B2 | 6/2014 | Minowa et al. |
| 8,913,166 B2 | 12/2014 | Okita |
| 9,001,249 B2 | 4/2015 | Iwane |
| 9,053,996 B2 | 6/2015 | Iwane et al. |
| 9,147,708 B2 | 9/2015 | Okita et al. |
| 2005/0174552 A1 | 8/2005 | Takada et al. |
| 2006/0208161 A1* | 9/2006 | Okita ................ H01L 27/14603 250/208.1 |
| 2007/0205439 A1 | 9/2007 | Okita et al. |
| 2011/0234433 A1* | 9/2011 | Aruga ................ H01L 23/5223 341/172 |
| 2013/0083225 A1 | 4/2013 | Minowa et al. |
| 2013/0113966 A1 | 5/2013 | Arishima et al. |
| 2013/0182161 A1 | 7/2013 | Nakajima |
| 2014/0036121 A1 | 2/2014 | Minowa et al. |
| 2014/0333815 A1 | 11/2014 | Iwane et al. |
| 2014/0340555 A1 | 11/2014 | Iwane et al. |

OTHER PUBLICATIONS

Japanese Office Action dated Jul. 14, 2016 during prosecution of related Japanese application No. 2014-167227.

Chinese Office Action dated Dec. 28, 2017 in Chinese Application No. 201510504182.0 (with whole English language translation).

* cited by examiner

SOLID-STATE IMAGING APPARATUS AND IMAGING SYSTEM HAVING FIRST AND SECOND METAL MEMBERS ARRANGED IN DIFFERENT DIRECTIONS

BACKGROUND OF THE INVENTION

Field of the Invention

The present invention relates to a solid-state imaging apparatus and an imaging system, and more particularly, to an output circuit of a solid-state imaging apparatus.

Description of the Related Art

A technology of reading pixel signals of a solid-state imaging apparatus is disclosed in FIG. 6 of Japanese Patent Application Laid-Open No. 2005-304077. The technology involves clamping an output signal of an upstream source follower circuit via a coupling capacitor and transmitting the clamped output signal to an input of a downstream source follower circuit.

SUMMARY OF THE INVENTION

A problem of the technology disclosed in Japanese Patent Application Laid-Open No. 2005-304077 is that a large parasitic capacitance in an input unit of the downstream source follower circuit deteriorates the signal gain.

It is an object of the present invention to provide a solid-state imaging apparatus that is reduced in the deterioration of the signal gain.

According to one embodiment of the present invention, there is provided a solid-state imaging apparatus, including: a first amplifier and a second amplifier; a coupling capacitor including a first electrode and a second electrode; a first metal member configured to connect an output terminal of the first amplifier and the first electrode; and a second metal member configured to connect an input terminal of the second amplifier and the second electrode, wherein, in a cross section perpendicular to a line that runs from the second electrode toward the input terminal of the second amplifier, the first metal member is arranged in at least two directions out of directions relative to the second metal member that are above, below, to left of, and to right of the second metal member.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
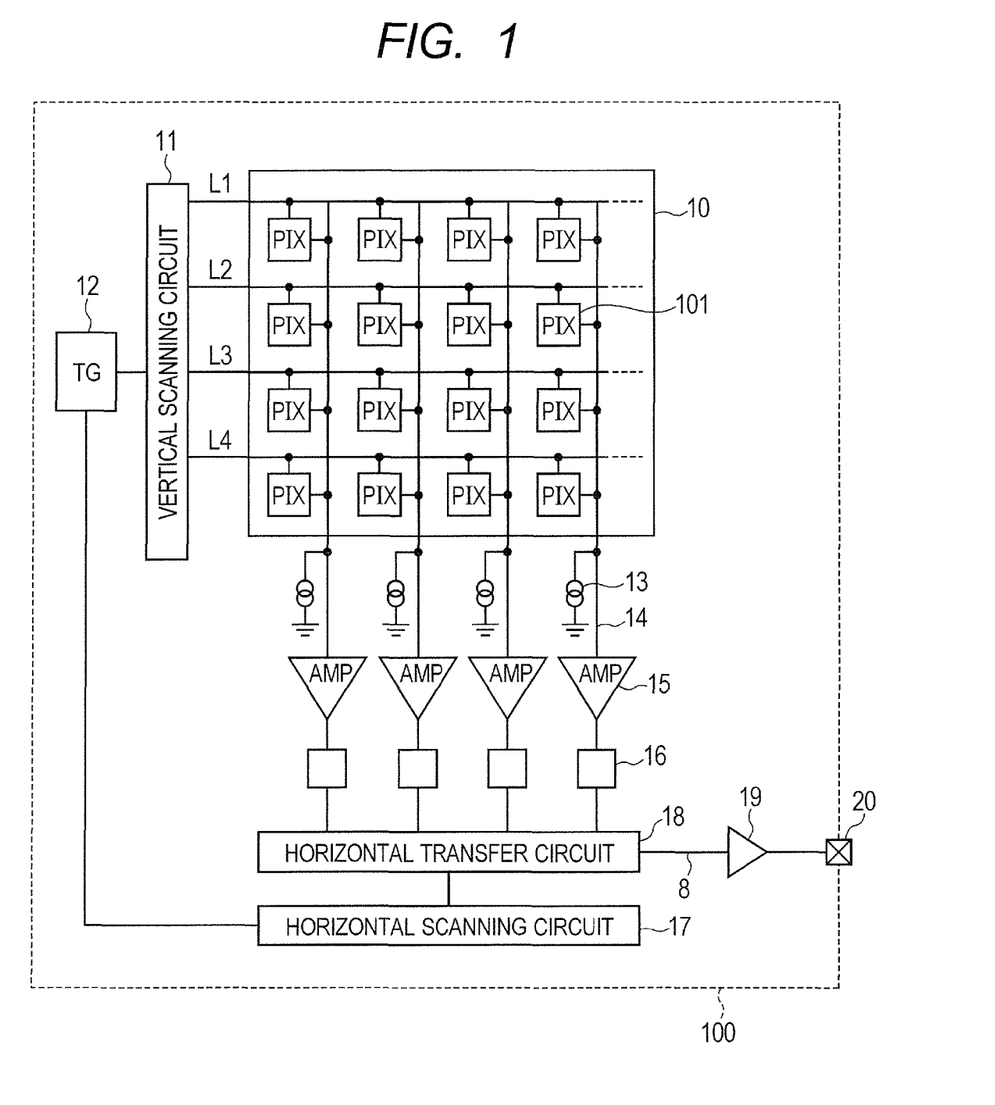
FIG. 1 is a circuit block diagram of a solid-state imaging apparatus according to a first embodiment of the present invention.

FIG. 1 is a block diagram of a solid-state imaging apparatus 100, which is an example of a solid-state imaging apparatus according to a first embodiment of the present invention. The solid-state imaging apparatus 100 is a CMOS area sensor, and includes a pixel array 10, a vertical scanning circuit 11, a timing generator (TG) 12, constant current circuits 13, column signal lines 14, amplifier circuits 15, electric charge accumulating units 16, a horizontal scanning circuit 17, a horizontal transfer circuit 18, an output circuit 19, and an output pad 20. The pixel array 10 includes a plurality of pixels (PIXs) 101 arranged in a two-dimensional matrix pattern along a row direction and a column direction. The pixel array 10 illustrated in FIG. 1 is a four rows by four columns matrix for the purpose of simplifying the drawing. However, the number of the pixels 101 is not particularly limited. The row direction and the column direction herein refer to a lateral direction in the drawings and a longitudinal direction in the drawings, respectively. In an example, the row direction corresponds to a horizontal direction in the imaging apparatus and the column direction corresponds to a vertical direction in the imaging apparatus.

The pixels 101 can each include a photodiode (photoelectric conversion unit), a floating diffusion, a transfer transistor, an amplifying transistor, a reset transistor, and a row selecting transistor. The transfer transistor transfers electric charges that are accumulated in the photodiode to the floating diffusion. The amplifying transistor outputs a signal corresponding to an electric potential in the floating diffusion. The reset transistor resets the electric potential of the floating diffusion. The row selecting transistor outputs the signal from the amplifying transistor to a vertical signal line. The amplifying transistor serves as a pixel output unit.

Signal lines L (L1 to L4) running in the row direction are arranged so that each row of the pixel array 10 is provided with one signal line L. The signal lines L1 to L4 each include a signal line TX (not shown), a signal line RES (not shown), and a signal line SEL (not shown). The signal line TX is used to drive the transfer transistor. The signal line RES is used to drive the reset transistor. The signal line SEL is used to drive the row selecting transistor. Applying H-level signals to these signal lines establishes electrical connection in the corresponding transistors (turns the transistors on). Applying L-level signals to these signal lines breaks electrical connection in the corresponding transistors (turns the transistors off).

One of the column signal lines 14 is arranged for each column of the pixel array 10. Each column signal line 14 is connected to sources of the respective row selecting transistors of the pixels 101 that are aligned in one column to serve as a signal line shared by these pixels 101. One constant current circuit 13, which serves as a load unit for the amplifying transistor, and one amplifying circuit 15 are connected to each column signal line 14. One of the electric charge accumulating units 16 is connected to an output end of each amplifying circuit 15. Each electric charge accumulating unit 16 includes a capacitor and a transistor, and holds a signal amplified by the amplifying circuit 15 that is connected to the electric charge accumulating unit 16. The horizontal scanning circuit 17 includes a shift register. The horizontal transfer circuit 18 includes a plurality of transistors. Based on control signals from the timing generator 12, the horizontal transfer circuit 18 sequentially turns on the transistors of the horizontal transfer circuit 18, and outputs signals of the electric charge accumulating units 16 to a horizontal signal line 8. The output circuit 19 functions as an output circuit that outputs a signal indicating a luminance voltage from the horizontal signal line 8 to the outside of the chip (the outside of the solid-state imaging apparatus) via the output pad 20.

Figure 2:
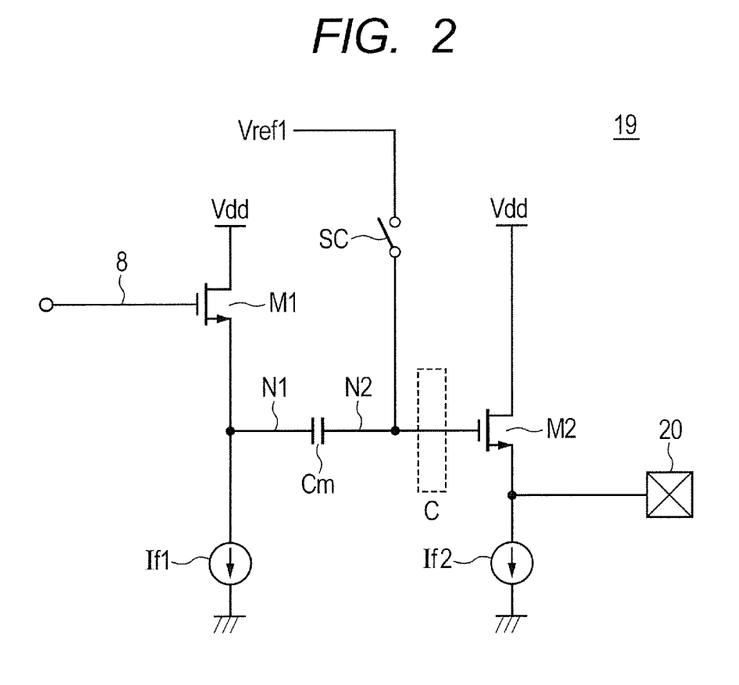
FIG. 2 is a circuit diagram of an output circuit according to the first embodiment.

FIG. 2 is a circuit diagram of the output circuit 19. The output circuit 19 includes a source follower MOS transistor M1 which forms a first amplifier, or a first-stage amplifier, a source follower MOS transistor M2 which forms a second amplifier, or a second-stage amplifier, a coupling capacitor Cm, constant current sources If1 and If2, which serve as load, and a switch SC. The MOS transistor M1 has a gate to which the horizontal signal line 8 is connected, a drain to which a power supply voltage Vdd is connected, and a source to which the constant current source If1 is connected. The MOS transistor M1 operates as a source follower and is low in the output impedance of the source. A first electrode of the coupling capacitor Cm is connected to a source electrode of the MOS transistor M1 via a node N1. A second electrode of the coupling capacitor Cm is connected to the switch SC and a gate electrode of the MOS transistor M2 via a node N2. The node N1 is made from a first metal member, which connects the source electrode of the MOS transistor M1 and the first electrode of the coupling capacitor Cm. The node N2 is made from a second metal member, which connects the gate electrode of the MOS transistor M2 and the second electrode of the coupling capacitor Cm. As illustrated in FIG. 2, none of the two electrodes of the coupling capacitor Cm is connected to a fixed-voltage node having a fixed voltage such as a ground voltage.

One end of the switch SC is connected to the node N2, and the other end of the switch SC is connected to a reference voltage Vref1. Switching the switch SC on during clamping connects the node N2 of the coupling capacitor Cm to the reference voltage Vref1. In other words, the node N2 of the coupling capacitor Cm is connected to the reference voltage Vref1 (a clamp voltage) during clamping and is in a floating state in other times than clamping. The reference voltage Vref1 is desirably set to, for example, a voltage optimum for the second-stage MOS transistor M2 to operate as a source follower. For example, the reference voltage Vref1 can be set to a voltage that does not allow a ground voltage GND or the power supply voltage Vdd to clip a luminance signal. The operating point of the MOS transistor M2 can be adjusted by applying a given clamp voltage to the node N2 of the coupling capacitor Cm in this manner.

The second-stage MOS transistor M2 has a drain to which the power supply voltage Vdd is connected and a source to which the constant current source If2 and the output pad 20 are connected. Similarly to the first-stage MOS transistor M1, the second-stage MOS transistor M2 operates as a source follower and is capable of outputting a signal to the output pad 20 while keeping the output impedance at the source low.

Figure 3A:
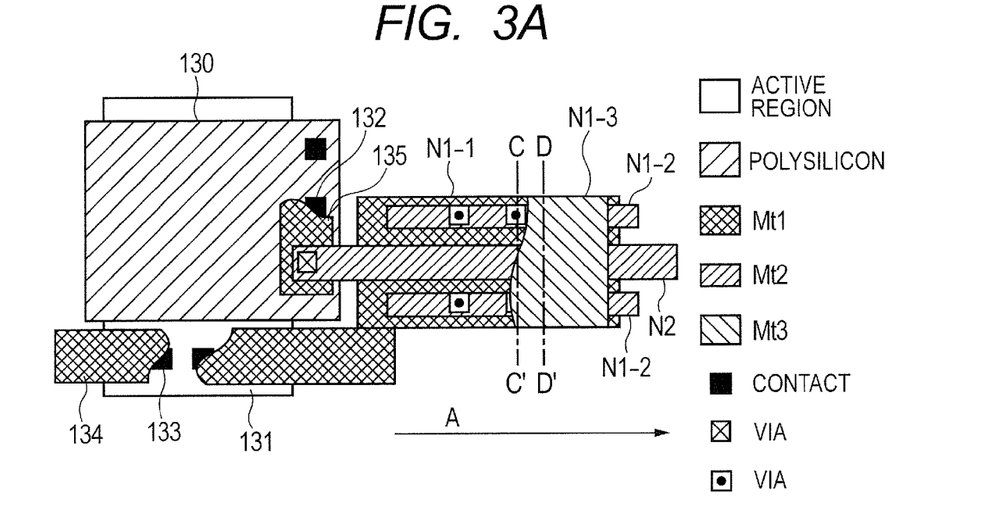
FIG. 3A is a layout plan view of the output circuit according to the first embodiment.

FIG. 3A is a layout plan view of an area of the output circuit that is indicated by C in FIG. 2. In FIG. 3A, the coupling capacitor Cm includes a second electrode 130, which is made of polysilicon, and a first electrode, which faces the second electrode 130 in an active region 131. The second electrode 130 also serves as the gate electrode of the MOS transistor that is not illustrated in FIG. 3A to FIG. 3C. A contact 133 is metal buried in a hole that pierces an insulating layer, and electrically connects the active region 131 in the semiconductor to the first metal member N1 (134) formed from a first metal wiring layer Mt1. Specifically, the first metal member N1 (134) is connected to an output terminal of the first-stage MOS transistor M1 and to the first electrode of the coupling capacitor Cm. A contact 132 is metal buried in a hole that pierces the insulating layer, and electrically connects the second electrode 130 to the first metal wiring layer (Mt1) 135. First metal members N1-1, N1-2, and N1-3 and the second metal member N2 stretch in a direction that runs from the electrodes of the coupling capacitor Cm toward the gate electrode of the second-stage source follower MOS transistor M2 (a direction indicated by the arrow A).

Figure 3B:
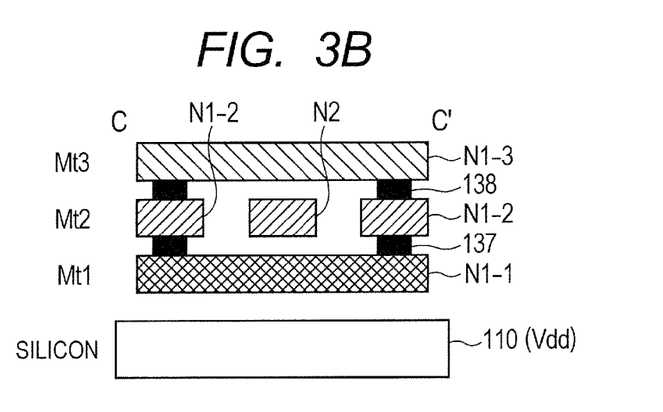
FIG. 3B and FIG. 3C are sectional views of the output circuit.
Figure 3C:
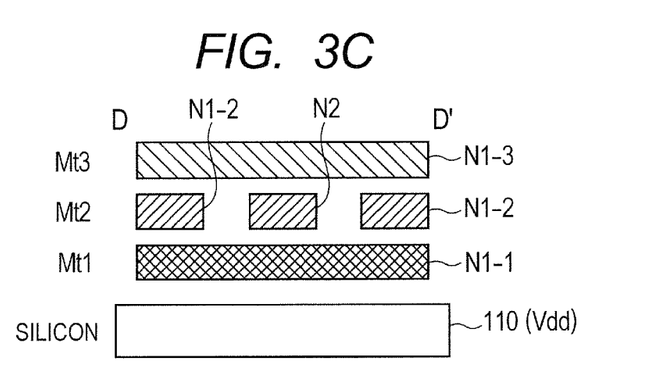

FIG. 3B is a sectional view of an area of FIG. 3A that is taken along the broken line C-C'. FIG. 3C is a sectional view of an area of FIG. 3A that is taken along the broken line D-D'. In FIG. 3B, a semiconductor substrate 110, which is given as an example, is made of n-type silicon, and the power supply voltage Vdd is applied to the semiconductor substrate 110. The first metal wiring layer Mt1, a second metal wiring layer Mt2, and a third metal wiring layer Mt3 are formed on the semiconductor substrate 110 in order, with an insulating layer sandwiched between every two metal wiring layers. The first metal member N1-1, which serves as a part of the node N1, is formed in the first metal wiring layer Mt1. Two of the first metal member N1-2, which serves as a part of the node N1, and the second metal member N2, which serves as the node N2, are formed in the second metal wiring layer Mt2. The first metal members N1-2 and the second metal member N2 each have a rectangular shape in plan view, and the second metal member N2 is placed between the two first metal members N1-2. The first metal member N1-3, which serves as a part of the node N1, is formed in the third metal wiring layer Mt3.

A via 137 is a piece of metal that pierces the insulating layer between the first metal wiring layer Mt1 and the second metal wiring layer Mt2 to electrically connect the first metal member N1-1 and each first metal member N1-2. A via 138 is a piece of metal that pierces the insulating layer between the second metal wiring layer Mt2 and the third metal wiring layer Mt3 to electrically connect each first metal member N1-2 and the first metal member N1-3. The first metal members N1-1, N1-2, and N1-3 in this embodiment surround the second metal member N2 in plan view.

In FIG. 3A, the first metal members N1-1, N1-2, and N1-3 and the second metal member N2 stretch in the direction that runs from the electrodes of the coupling capacitor Cm toward the gate of the second-stage source follower MOS transistor M2 (the direction indicated by the arrow A). In FIG. 3B, the second metal member N2 is surrounded by the first metal members N1-1, N1-2, and N1-3 and the vias 137 and 138. Specifically, in the sectional view (FIG. 3B) including the vias 137 and 138, the second metal member N2 of the node N2 is surrounded 360° by the first metal members N1-1, N1-2, and N1-3 and the vias 137 and 138. In the section along D-D' (FIG. 3C) where no via is formed, the first metal members N1-1, N1-2, and N1-3 are arranged in four directions relative to the second metal member N2 of the node N2: above, below, to the left of, and to the right of the second metal member N2. "Above and below" the second metal member N2 are two directions perpendicular to the second metal member N2 in FIG. 3B and FIG. 3C. "The left and right" of the second metal member N2 are two directions horizontal to the second metal member N2 in FIG. 3B and FIG. 3C.

When a parasitic capacitance between the node N2 and the power supply voltage Vdd, or between the node N2 and a ground portion of the circuit, is given as Cp, the signal gain from the node N1 to the node N2 drops to Cm/(Cm+Cp) due to capacitance division between the coupling capacitor Cm and the parasitic capacitance Cp. Accordingly, the drop in signal gain can be reduced if the parasitic capacitance Cp is made smaller. The parasitic capacitance Cp between the second metal member and the power supply voltage Vdd, or between the second metal member and the ground portion, is reduced in this embodiment by surrounding the second metal member (node N2) with the first metal member (node N1). The equivalent capacitance of the coupling capacitor Cm is not changed by the reduction in the areal dimensions of the coupling capacitor Cm because a parasitic capacitance between the first metal member N1 and the second metal member N2 increases.

In this embodiment, the first metal member is arranged in four directions relative to the second metal member: above, below, to the left of, and to the right of the second metal member, and hence the parasitic capacitance Cp can be minimized. In the area where the vias are formed, in particular, the second metal member is surrounded completely by the first metal member, and hence the effect of reducing the parasitic capacitance Cp is greater.

This embodiment can make the parasitic capacitance Cp of the node N2 smaller, and can accordingly reduce the deterioration of the signal gain. An experiment result shows that the signal gain is 0.95 in the output circuit after this embodiment is applied, whereas the voltage gain of the output circuit prior to the application of this embodiment is 0.90. In addition, the small parasitic capacitance Cp means a shorter signal transmission time, namely, higher speed transmission.

Second Embodiment

Figure 4:
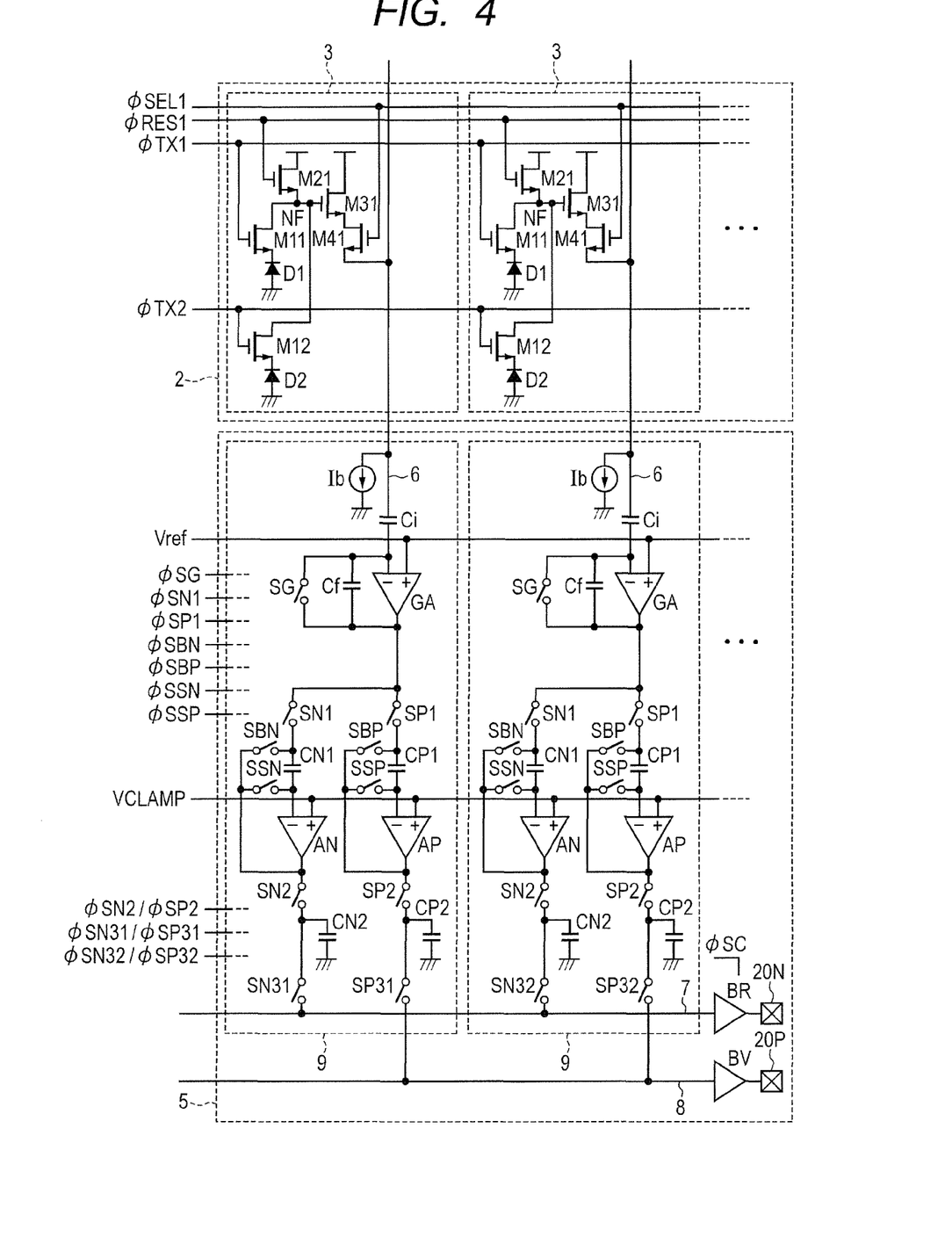
FIG. 4 is a circuit diagram of a solid-state imaging apparatus according to a second embodiment of the present invention.

FIG. 4 is a circuit diagram of a solid-state imaging apparatus that is an example of a solid-state imaging apparatus according to a second embodiment of the present invention. The solid-state imaging apparatus is a CMOS area sensor, and includes a pixel array 2 and a peripheral circuit unit 5. The solid-state imaging apparatus also includes a timing generator (not shown) for generating control signals, and a vertical scanning circuit (not shown) for scanning the rows of the pixel array 2. The pixel array 2 includes a plurality of pixel units 3 arranged in a two-dimensional matrix pattern along a row direction and a column direction.

The pixel units 3 have a two-pixel sharing structure. Each pixel unit 3 in FIG. 4 can include photodiodes D1 and D2, a transfer transistor M11 of the first row, a transfer transistor M12 of the second row, a reset transistor M21, an amplifying transistor M31, a selecting transistor M41, and an input node NF of the amplifying transistor M31. The input node NF is connected to drains of the transfer transistors M11 and M12, a source of the reset transistor M21, and a gate of the amplifying transistor M31.

In the pixel unit 3 where two pixels are shared, the two photodiodes D1 and D2 and the two transfer transistors M11 and M12 share the one reset transistor M21, amplifying transistor M31, selecting transistor M41, and input node NF. The pixel array 2 illustrated in FIG. 4 has two rows by two columns of pixels. However, the pixel array 2 may actually have several thousand rows by several thousand columns of pixels. When the row count and column count of the pixel array 2 are given as M and N, respectively, the pixel units 3 in each of which two pixels are shared are arranged in the pattern of a M/2 rows by N columns matrix.

A control signal φTX1 is supplied to a gate of the transfer transistor M11. When the supplied control signal φTX1 is at the high level, the transfer transistor M11 transfers electric charges of the photodiode D1 to the input node NF. Similarly, a control signal φTX2 is supplied to a gate of the transfer transistor M12 and, when the supplied control signal φTX2 is at the high level, the transfer transistor M12 transfers electric charges of the photodiode D2 to the input node NF. The amplifying transistor M31 outputs a signal corresponding to an electric potential of the input node NF. A control signal φRES1 is supplied to a gate of the reset transistor M21. When the supplied control signal φRES1 is at the high level, the reset transistor M21 resets the electric charges of the input node NF. A control signal φSEL1 is supplied to a gate of the selecting transistor M41. When the supplied control signal φSEL1 is at the high level, the selecting transistor M41 outputs the signal from the amplifying transistor M31 to a relevant column signal line 6.

Each column reading circuit 9 includes a column current source Ib, a gain amplifier GA, an input capacitor Ci, a feedback capacitor Cf, a reset voltage capacitor CN1, a luminance voltage capacitor CP1, a reset voltage capacitor CN2, a luminance voltage capacitor CP2, a reset voltage amplifier AN, and a luminance voltage amplifier AP. The column reading circuit 9 also includes switches SG, SN1, SP1, SBN, SSN, SBP, SSP, SN2, SP2, SN31, and SP31, which are built from MOS transistors. The switches are each driven by the timing generator (not shown) and a horizontal scanning circuit (not shown).

When the selecting transistor M41 is turned on, the column current source Ib serves as load of the amplifying transistor M31. The gain amplifier GA includes a differential amplifier that has a non-inverting input to which a reference voltage Vref is applied and an inverting input to which one column signal line 6 is connected via the input capacitor Ci. The switch SG is connected in parallel to the feedback capacitor Cf. When the switch SG is switched on, the gain amplifier GA operates as a voltage follower. When the switch SG is switched off, the gain amplifier GA operates at a gain of Ci/Cf.

The reset voltage capacitor CN1 is a capacitor for holding a signal that is used during resetting. "During resetting" is a period prior to the transfer of electric charges of the photodiode D1. Specifically, a signal corresponding to the electric potential of the input node NF during resetting is written in the reset voltage capacitor CN1 via the amplifying transistor M31 and the gain amplifier GA. The luminance voltage capacitor CP1 is a capacitor for holding a luminance voltage. A signal corresponding to the electric potential of the input node NF after electric charges of the photodiode D1 are transferred is written in the luminance voltage capacitor CP1 via the amplifying transistor M31 and the gain amplifier GA.

The reset voltage amplifier AN includes a differential amplifier that has a non-inverting input to which a clamp voltage VCLAMP is applied and an inverting input to which the reset voltage capacitor CN1 is connected. An output of the reset voltage amplifier AN is connected to the reset voltage capacitor CN2 via the switch SN2. The reset voltage capacitor CN2 is also connected to a reset voltage horizontal signal line 7 via the switch SN31. The horizontal signal line 7 is connected to a reset voltage output circuit BR. The output circuit BR is configured similarly to the output circuit 19 in the first embodiment, and includes two source follower MOS transistors (which form a first-stage amplifier (first amplifier) and a second-stage amplifier (second amplifier) respectively), two constant current circuits, and a clamping switch. A control signal φSC for driving the clamping switch is input to the output circuit BR. An output end of the output circuit BR is connected to an output pad 20N for outputting a signal to the outside of the chip. The reset voltage is output to the outside of the chip from the output pad 20N. The luminance voltage amplifier AP, the luminance voltage capacitor CP2, and a luminance voltage output circuit BV are configured similarly to the components for the reset voltage, and the luminance voltage is output to the outside of the chip from an output pad 20P. Outside the chip, a luminance voltage from which a noise component has been removed is generated by a correlated double sampling circuit (not shown).

Figure 5:
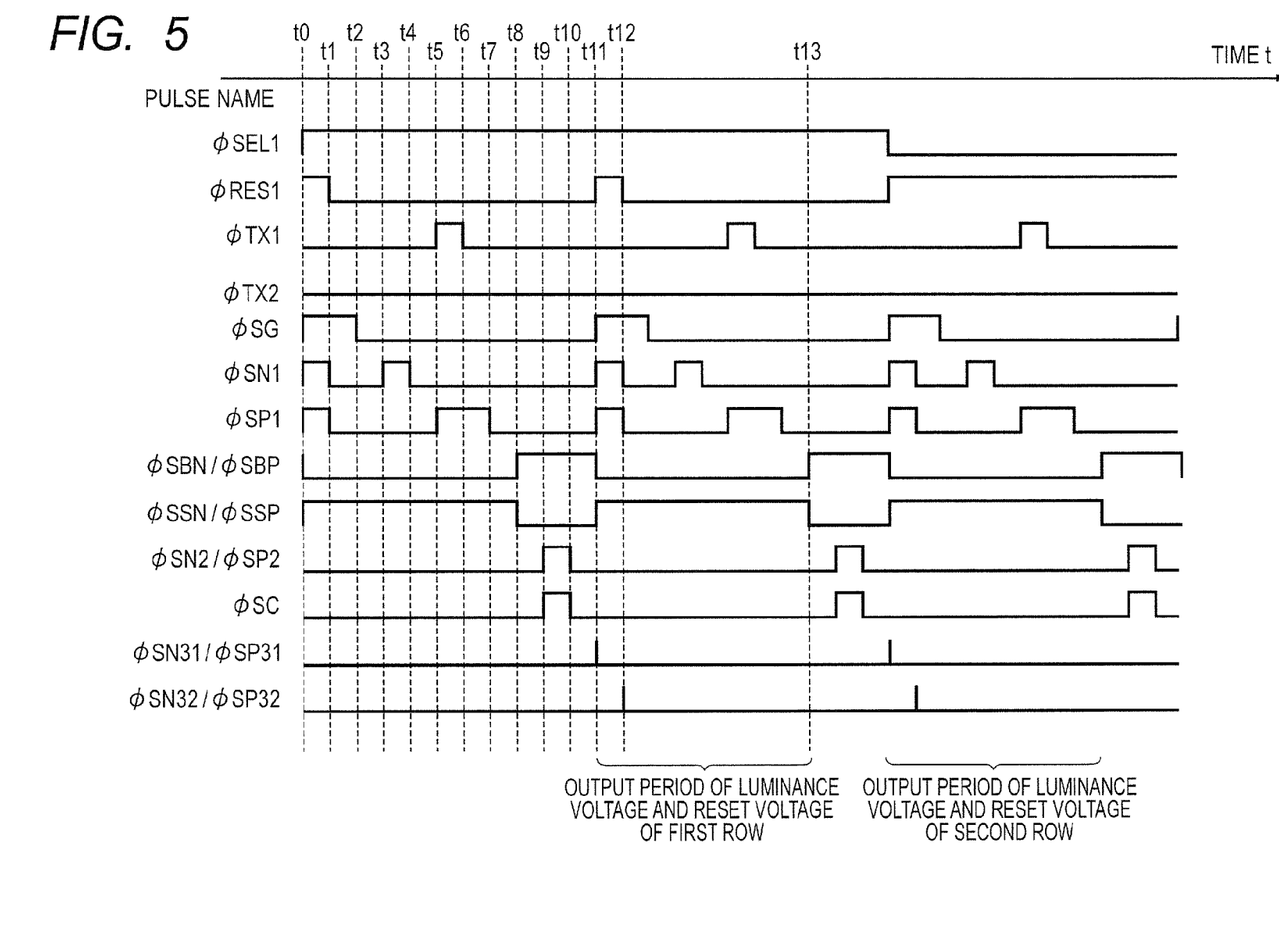
FIG. 5 is a timing chart of the solid-state imaging apparatus according to the second embodiment.

The operation of the CMOS area sensor according to the second embodiment is described with reference to a timing chart of FIG. 5. At a time t0, φSEL1 is at the high level and the selecting transistor M41, which is an n-type MOS transistor, is turned on to select the first row and the second row of the pixel array 2. At the same time, φSG that is at the high level switches the switch SG on, thereby causing the gain amplifier GA to operate as a voltage follower and to output the reference voltage Vref. The signals φSN1 and φSP1 are also at the high level, which means that the reference voltage Vref is written in the reset voltage capacitor CN1 and the luminance voltage capacitor CP1 via the gain amplifier GA.

The signals φSBN and φSBP that are at the low level switch off the switches SBN and SBP, and φSSN and SSP that are at the high level switch on the switches SSN and SSP. This puts the reset voltage amplifier AN and the luminance voltage amplifier AP into a sampling mode, and makes the reset voltage capacitor CN1 and the luminance voltage capacitor CP1 ready for signal writing.

At a time t1, φRES1 changes to the low level, thereby turning off the n-type MOS reset transistor M21 of the pixel array 2 and putting the input node NF into a floating state. The signals φSN1 and φSP1 change to the low level, thereby switching off the switches SN1 and SP1 and ending the writing of Vref in the reset voltage capacitor CN1 and the luminance voltage capacitor CP1.

At a time t2, φSG changes to the low level, thereby switching the switch SG off and changing the gain of the gain amplifier GA to Ci/Cf. At a time t3, φSN1 changes to the high level, thereby switching the switch SN1 on. This starts the writing of a signal corresponding to the electric potential of the input node NF of the pixel array 2 during resetting in the reset voltage capacitor CN1 via the amplifying transistor M31 that has the column current source Ib as load. In other words, a signal that is used in a period prior to the transfer of electric charges of the photodiode D1 is supplied to the reset voltage capacitor CN1. At a time t4, φSN1 changes to the low level, thereby switching the switch SN1 off and ending the writing of the reset voltage of the input node NF in the reset voltage capacitor CN1.

At a time t5, φTX1 changes to the high level, thereby turning the transfer transistor M11 on and transferring electrons that have been accumulated as a result of irradiating the photodiode D1 with light to the input node NF. Then, the electric potential of the input node NF drops by an amount that is in relation to the amount of the accumulated electrons of the photodiode D1. At the same time, φSP1 changes to the high level, thereby switching the switch SP1 on. This starts the writing of the dropped voltage of the input node NF in the luminance voltage capacitor CP1 via the amplifying transistor M31. At a time t6, φTX1 changes to the low level, thereby turning the transfer transistor M1 off and ending the transfer of electrons that have been accumulated as a result of irradiating the photodiode D1 with light to the input node NF.

At a time t7, φP1 changes to the low level, thereby switching the switch SP1 off and ending the writing of the luminance voltage in the luminance voltage capacitor CP1. At a time t8, φSBN and φSBP change to the high level, thereby switching the switches SBN and SBP on, and φSSN and SSP change to the low level, thereby switching the switches SSN and SSP off. This puts the reset voltage amplifier AN into a reading mode for reading a signal of the reset voltage capacitor CN1, and puts the luminance voltage amplifier AP into a reading mode for reading a signal of the luminance voltage capacitor CP1.

At a time t9, φSN2 changes to the high level, thereby switching the switch SN2 on. This causes the reset voltage amplifier AN to start writing the reset voltage that has been written in the reset voltage capacitor CN1 in the second reset voltage capacitor CN2. The signal φSP2 also changes to the high level, thereby switching the switch SP2 on. This causes the luminance voltage amplifier AP to start writing the luminance voltage of the photodiode D1, which has been written in the luminance voltage capacitor CP1, in the second luminance voltage capacitor CP2. The signal φSC also changes to the high level at this point, thereby switching on the switch SC of the output circuits BR and BV, and giving the reference voltage Vref1 to metal wiring N2. The reference voltage Vref1 is a gate voltage optimum for the second-stage source follower MOS transistor M2 to operate as a source follower.

At a time t10, φSN2 and φSP2 change to the low level, thereby ending the writing of the reset voltage in the second reset voltage capacitor CN2 and the writing of the luminance voltage in the second luminance voltage capacitor CP2. The signal φSC also changes to the low level, thereby switching the switch SC off and putting the second metal member (metal wiring) N2 into a floating state.

At a time t11, φRES1 changes to the high level, thereby turning on the nMOS reset transistor M21 of the pixel array 2 and resetting the input node NF to a voltage that is close to a power supply voltage VDD. At the same time, φSBP changes to the low level, thereby switching the switch SBP off, and φSSP changes to the high level, thereby switching the switch SSP on. This puts the luminance voltage amplifier AP into the sampling mode and makes the luminance voltage capacitor CP1 ready for signal writing.

The signals φSN31 and φSP31 are also at the high level at the time t11, which means that the switches SN31 and SP31 are switched on. Then, the reset voltage and luminance voltage of the first row and the first column that have been accumulated in the second reset voltage capacitor CN2 and the second luminance voltage capacitor CP2 are respectively read onto the reset voltage horizontal signal line 7 and the luminance voltage horizontal signal line 8. When the capacitance of the second luminance voltage capacitor CP2 is given as C1, and a capacitance that the reset voltage horizontal signal line 7 and the luminance voltage horizontal signal line 8 has is given as C2, the reset voltage and the luminance voltage are read at a voltage gain expressed by $C1/(C1+C2)$.

The output circuit BR and the output circuit BV output the reset voltage and the luminance voltage of the first row and the first column to the outside of the chip via the reset voltage horizontal signal line 7 and the luminance voltage horizontal signal line 8, respectively. Outside the chip, a signal is generated by subtracting the reset voltage from the luminance voltage to obtain a luminance voltage that has undergone correlated double sampling.

A period from the time t0 to the time t11 is one horizontal scanning period in which the luminance voltage and reset voltage of one row of pixels are read.

At a time t12, φSN32 and φSP32 are at the high level, which means that the switches SN32 and SP32 are switched on. Then, the reset voltage and luminance voltage of the first row and the second column that have been accumulated in the second reset voltage capacitor CN2 and the second luminance voltage capacitor CP2 are read onto the reset voltage horizontal signal line 7 and the luminance voltage horizontal signal line 8, respectively. The output circuit BR and the output circuit BV subsequently output the reset voltage and luminance voltage of the first row and the second column to the outside of the chip via the reset voltage horizontal signal line 7 and the luminance voltage horizontal signal line 8, respectively.

At a time t13, the output circuits BR and BV finish outputting the luminance voltage and reset voltage of the first row and all columns up through the last column from the chip. In other words, a period from the time t11 to the time t13 is an output period in which the luminance voltage and reset voltage of the first row of the pixel array 2 are output.

The output circuits BR and BV of the CMOS area sensor do not belong to any column reading circuit 9 of the peripheral circuit unit 5, and are therefore often arranged in a narrow area near the output pads 20N and 20P. For that reason, the second-stage source follower MOS transistor M2 is laid out so that the driving power is increased by splitting a gate electrode. This makes the second metal member N2 long as illustrated in the plan view of FIG. 3A, and increases the parasitic capacitance Cp between the second metal member N2 and a fixed-voltage node. The parasitic capacitance Cp can be reduced by surrounding the second metal member N2 with the first metal member N1 as illustrated in FIG. 3B and FIG. 3C, and the effect provided by the present invention is particularly prominent in an output circuit of a solid-state imaging apparatus.

As has been described, according to this embodiment, the parasitic capacitance Cp of the second metal member N2 with respect to a fixed-voltage node is made smaller by surrounding the second metal member N2 with the first metal member N1. The drop in signal gain from the first metal member N1 to the second metal member N2 can thus be reduced and high speed signal transmission is accomplished.

Third Embodiment

Figure 6:
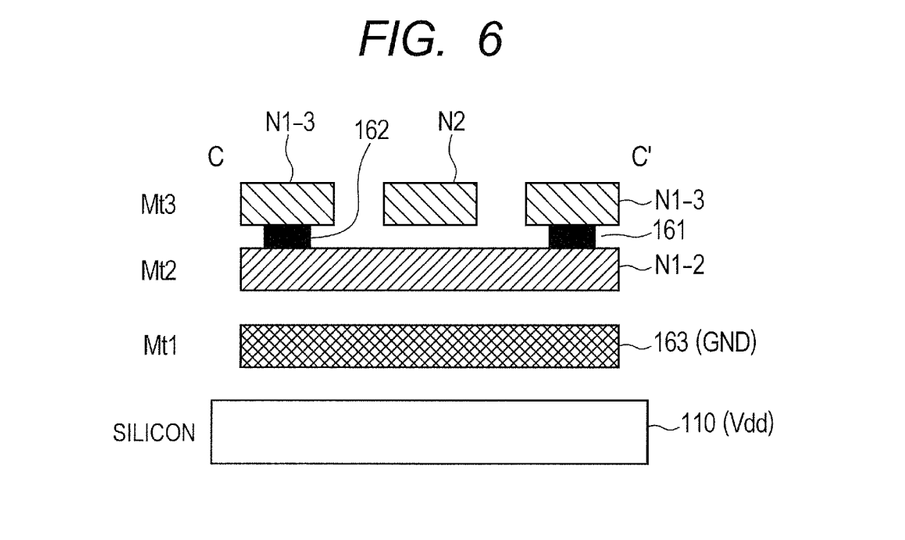
FIG. 6 is a layout sectional view of an output circuit according to a third embodiment of the present invention.

FIG. 6 is a layout sectional view of an output circuit according to a third embodiment of the present invention, and corresponds to a sectional view of an area of FIG. 3A that is taken along the broken line C-C'. The first metal wiring layer Mt1, the second metal wiring layer Mt2, and the third metal wiring layer Mt3 are formed on the semiconductor substrate 110 in order, with an insulating layer sandwiched between every two metal wiring layers. A GND 163 is formed in the first metal wiring layer Mt1. The first metal member N1-2, which serves as a part of the node N1, is formed in the second metal wiring layer Mt2. Two first metal members N1-3, which serve as a part of the node N1, and the second metal member N2, which serves as the node N2, are formed in the third metal wiring layer Mt3.

Vias 161 and 162 connect the first metal member N1-2 to the first metal members N1-3. These first metal members N1-2 and N1-3 and second metal member N2 stretch in plan view in a direction that runs from the electrodes of the coupling capacitor Cm toward an input of the second-stage source follower MOS transistor M2. In the sectional view of FIG. 6, the first metal member N1-2 is placed below the second metal member N2, and the two first metal members N1-3 are placed so that one first metal member N1-3 is on each side of the second metal member N2. In other words, the second metal member N2 is surrounded by the first metal member N1 in three directions, below, to the left of, and to the right of the second metal member N2.

The rest of the configuration of the third embodiment is the same as those in the first embodiment and the second embodiment. In other words, the output circuit according to this embodiment is applicable to an output circuit in a solid-state imaging apparatus, in particular, an output circuit that outputs a signal to the outside of a chip. In the third embodiment, the parasitic capacitance Cp of the second metal member N2 with respect to the power supply voltage, or to the ground portion, is made small as in the first embodiment and the second embodiment, and the drop in gain from the first metal member N1 to the second metal member N2 is accordingly reduced. High speed signal transmission is thus accomplished.

Fourth Embodiment

Figure 7:
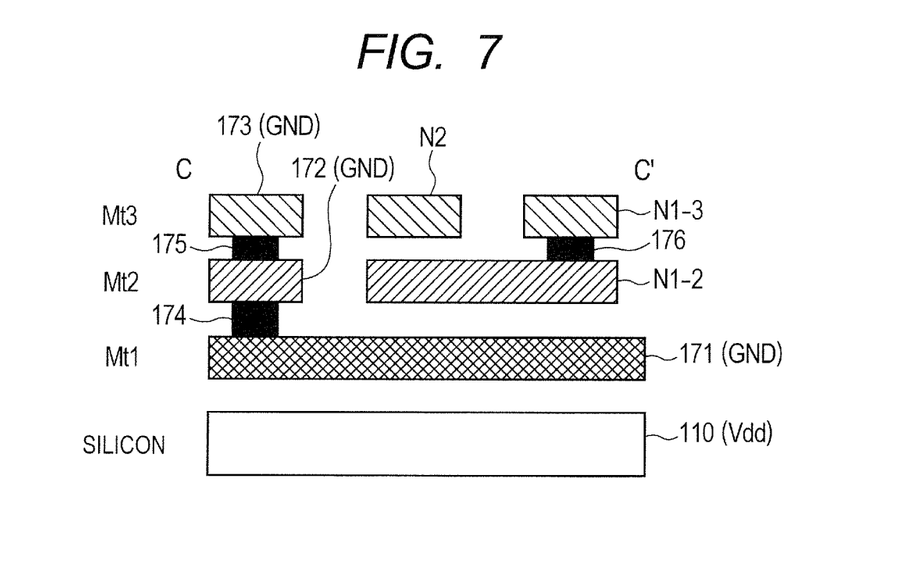
FIG. 7 is a layout sectional view of an output circuit according to a fourth embodiment of the present invention.

FIG. 7 is a sectional view of an output circuit according to a fourth embodiment of the present invention, and corresponds to a sectional view of an area of FIG. 3A that is taken along the broken line C-C'. In this embodiment, a GND 171 is formed from the first metal wiring layer Mt1, a GND 172 and a first metal member N1-2 are formed from the second metal wiring layer Mt2, and a GND 173, a first metal member N1-3, and the second metal member N2 are formed from the third metal wiring layer Mt3. The GNDs 171, 172, and 173 are connected by vias 174 and 175. The first metal members N1-2 and N1-3 are connected by a via 176.

In a cross section perpendicular to a line that runs from the electrodes of the coupling capacitor Cm toward an input of the second-stage source follower MOS transistor M2, the first metal member N1 is arranged in two directions relative to the second metal member N2, below and to the right of the second metal member N2. This makes the parasitic capacitance Cp of the second metal member N2 with respect to a fixed-voltage node small in the fourth embodiment as in the first embodiment to the third embodiment, and accordingly reduces the drop in gain from the first metal member N1 to the second metal member N2. High speed signal transmission is thus accomplished.

Fifth Embodiment

Figure 8:
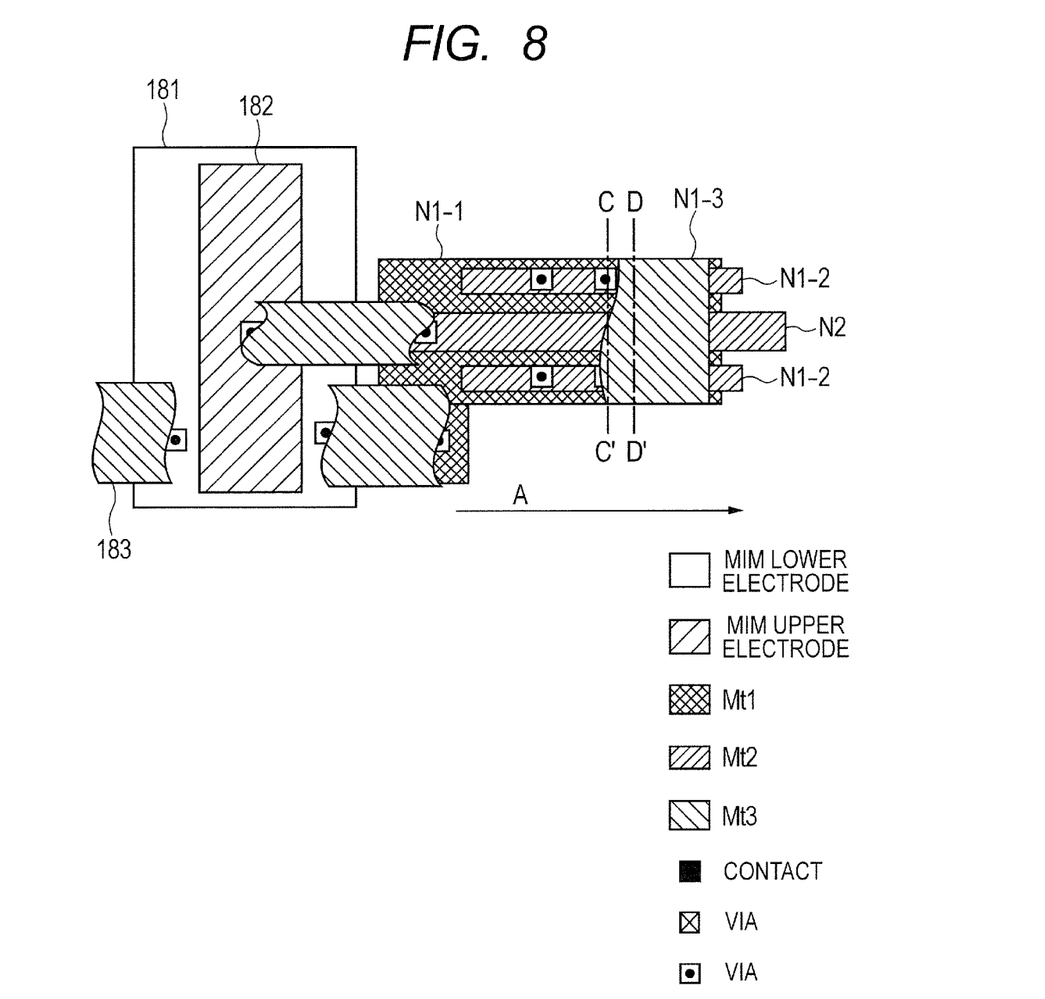
FIG. 8 is a layout plan view of an output circuit according to a fifth embodiment of the present invention.

The coupling capacitor Cm in a fifth embodiment of the present invention is built from a metal-insulator-metal (MIM) capacitor. FIG. 8 is a layout plan view of an output circuit according to the fifth embodiment. The coupling capacitor Cm includes an MIM lower electrode 181 as a first electrode and an MIM upper electrode 182 as a second electrode. The MIM lower electrode 181 is connected to a source output of the first-stage source follower MOS transistor M1 via the third metal wiring layer Mt3 (183). The MIM upper electrode 182 is connected to a gate input of the second-stage source follower MOS transistor M2. A sectional view of an area of FIG. 8 that is taken along the broken line C-C' and a sectional view of an area of FIG. 8 that is taken along the broken line D-D' correspond to FIG. 3B and FIG. 3C, respectively. As described in the fifth embodiment, the coupling capacitor Cm of the present invention is applicable to an MIM capacitor as well.

In the fifth embodiment, the parasitic capacitance Cp of the second metal member N2 with respect to a fixed-voltage node is made small as in the first embodiment to the fourth embodiment, and the drop in gain from the first metal member N1 to the second metal member N2 is accordingly reduced. High speed signal transmission is thus accomplished.

Sixth Embodiment

Figure 9:
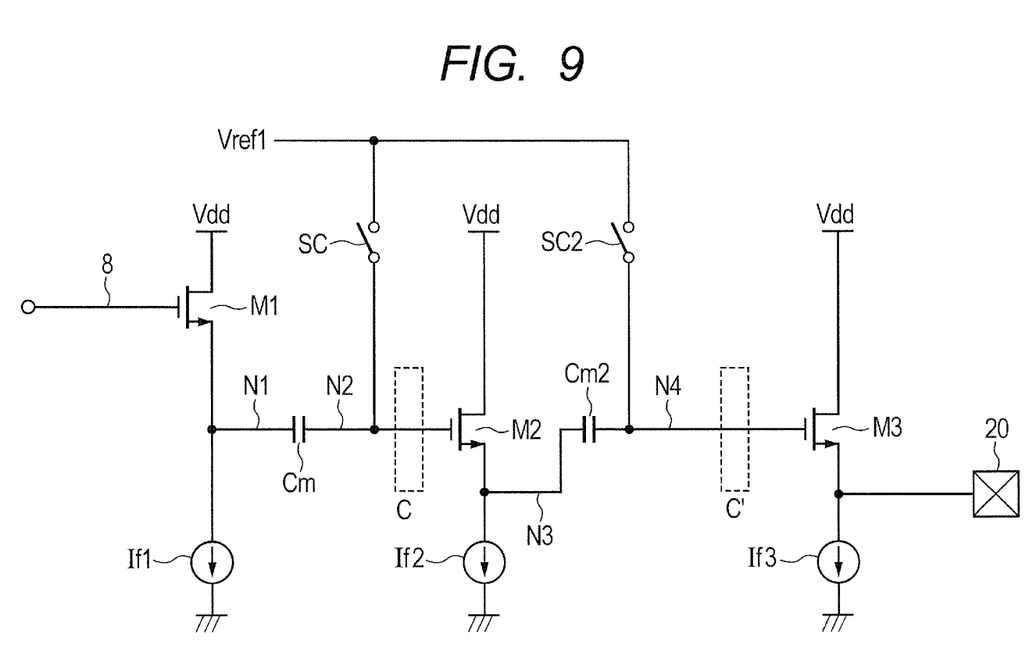
FIG. 9 is a circuit diagram of an output circuit according to a sixth embodiment of the present invention.

FIG. 9 is a circuit diagram of an output circuit according to a sixth embodiment of the present invention. The output circuit according to the sixth embodiment includes source follower circuits at three stages. In FIG. 9, components that are the same as those in the output circuit 19 of FIG. 2 are denoted by the same reference symbols. The output circuit includes the first-stage source follower MOS transistor M1, the second-stage source follower MOS transistor M2, a third-stage source follower MOS transistor M3, the coupling capacitor Cm, a coupling capacitor Cm2, the constant current sources If1 and If2, a constant current source If3, the switch SC, and a switch SC1. A node N3 is made from a third metal member, which connects an output terminal of the second-stage source follower MOS transistor M2 and a first electrode of the coupling capacitor Cm2. A node N4 is made from a fourth metal member, which connects an input terminal of the third-stage source follower MOS transistor M3 and an electrode of the coupling capacitor Cm2. The switch SC2 connects the reference voltage Vref1 and the node N4. The constant current source If3 is a load constant current source of the third-stage source follower MOS transistor M3.

A plan view of an area indicated by a broken-line frame C in the circuit diagram of FIG. 9 is the same as FIG. 3A, which has been described in the first embodiment. A sectional view of an area that is indicated by a dotted-line frame C' in FIG. 9 is the same as the sectional views of FIG. 3B and FIG. 3C, which have been described in the first embodiment, except that the first metal member N1 and the second metal member N2 are read as the third metal member N3 and the fourth metal member N4, respectively.

As described in the sixth embodiment, the present invention is applicable not only to a two-stage amplifier but also to a multi-stage amplifier that has three or more stages. The parasitic capacitance Cp of the second metal member N2 with respect to a fixed-voltage node is made small in the sixth embodiment as in the first embodiment, and the drop in gain from the first metal member N1 to the second metal member N2 is accordingly reduced. High speed signal transmission is thus accomplished.

Seventh Embodiment

A seventh embodiment of the present invention is an example of applying the present invention to a gain amplifier that uses a coupling capacitor for its input unit. Described here is an example of application to the gain amplifier GA of FIG. 4. The description given here uses the output circuit diagram of the second embodiment and the reference symbols of the layout thereof.

The first-stage amplifier corresponds to the amplifying transistor M31 of the pixel array 2. The second-stage amplifier corresponds to the gain amplifier GA of the peripheral circuit unit 5. The coupling capacitor corresponds to the input capacitor Ci. The node N1 corresponds to a first metal member connected to a column signal line. The node N2 corresponds to a second metal member connected to an input of the gain amplifier GA. In other words, the first metal member N1 connects an output (the selecting transistor M41) of the first-stage amplifier and one of the electrodes of the coupling capacitor Ci, and the second metal member N2 connects the other electrode of the coupling capacitor Ci and an input terminal of the second-stage amplifier GA.

Also in this embodiment, as in the first embodiment to the sixth embodiment, the second metal member N2 is surrounded by the first metal member N1. Thus, the parasitic capacitance Cp of the second metal member N2 with respect to a fixed-voltage node is made small, and the drop in gain from the first metal member N1 to the second metal member N2 is accordingly reduced. High speed signal transmission is thus accomplished.

Eighth Embodiment

Figure 10:
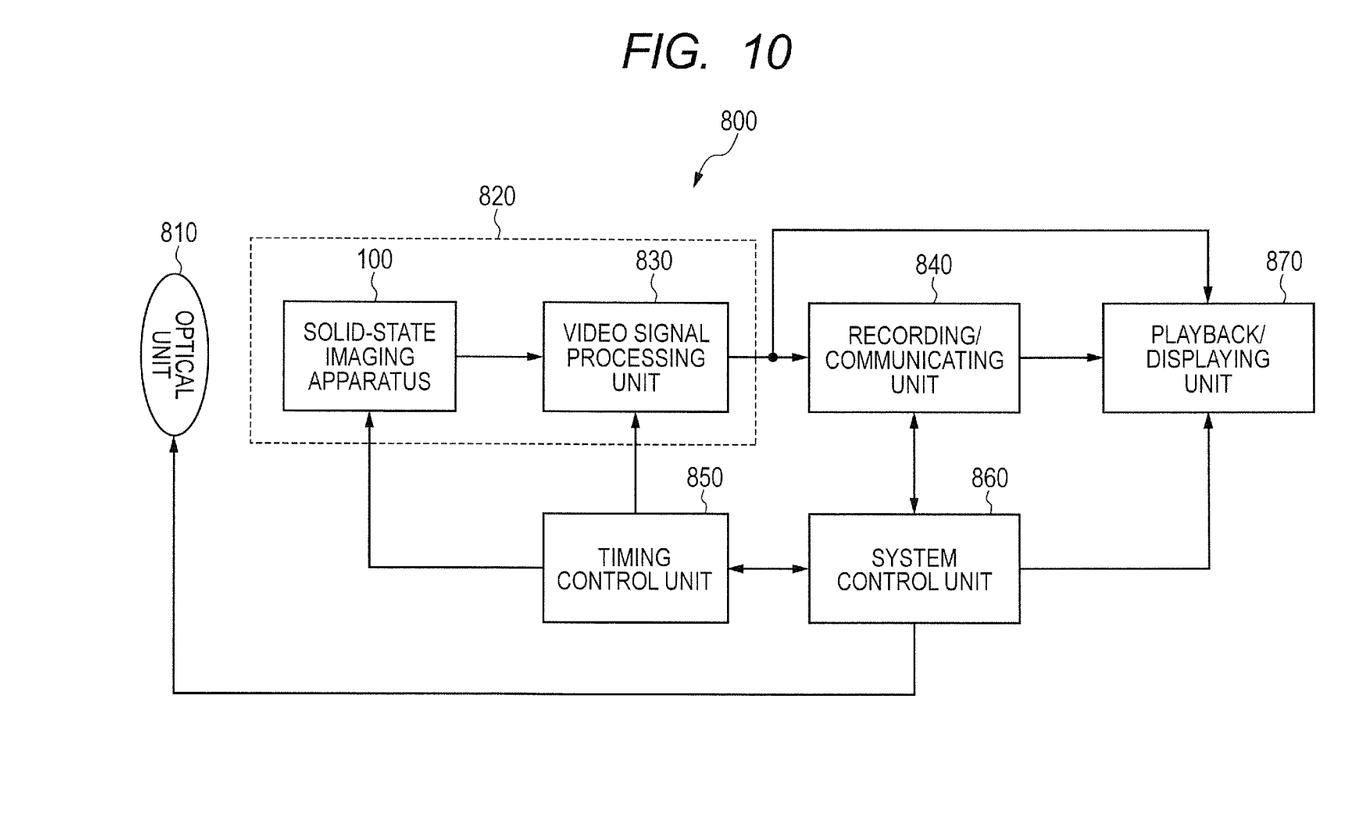
FIG. 10 is a block diagram of a solid-state imaging apparatus system according to an eighth embodiment of the present invention.

FIG. 10 is a diagram for illustrating a configuration example of an imaging system according to an eighth embodiment of the present invention. The imaging system, which is denoted by 800, includes, for example, an optical unit 810, the solid-state imaging apparatus 100, a video signal processing unit 830, a recording/communicating unit 840, a timing control unit 850, a system control unit 860, and a playback/displaying unit 870. An imaging system 820 includes the solid-state imaging apparatus 100 and the video signal processing unit 830. The solid-state imaging apparatus 100 is the solid-state imaging apparatus 100 described in the foregoing embodiment. An imaging system can include a digital camera, a video camera, a smart phone, and other various apparatus having a photographing function.

The optical unit 810, which is an optical system such as a lens, focuses light from a subject on the pixel array 10 of the solid-state imaging apparatus 100 which has a plurality of pixels arranged in a two-dimensional pattern, to thereby form an image of the subject. The solid-state imaging apparatus 100 outputs a signal corresponding to the light focused on the pixel array 10, at timing based on a signal from the timing control unit 850. The signal output from the solid-state imaging apparatus 100 is input to the video signal processing unit 830, which is a unit for processing video signals, and is processed by the video signal processing unit 830 through a method prescribed by a program or the like. A signal obtained through the processing in the video signal processing unit 830 is sent as image data to the recording/communicating unit 840. The recording/communicating unit 840 sends a signal for forming an image to the playback/displaying unit 870, and the playback/displaying unit 870 plays/displays a video or a still image. When receiving the signal from the video signal processing unit 830, the recording/communicating unit 840 also executes an operation of holding communication to and from the system control unit 860, and an operation of recording the signal for forming an image in a recording medium (not shown).

The system control unit 860 is used for overall control of the operation of the imaging system, and controls the driving of the optical unit 810, the timing control unit 850, the recording/communicating unit 840, and the playback/displaying unit 870. The system control unit 860 includes a storage device (not shown), which is, for example, a recording medium, to record, among others, a program necessary to control the operation of the imaging system in the storage device. The system control unit 860 also supplies, for example, a signal for switching a driving mode depending on a user's operation to a component inside the imaging system. Specific examples include changing a row that is to be read or reset, changing the field angle for electronic zooming, and shifting the field angle for electronic vibration control. The timing control unit 850 controls the driving timing of the solid-state imaging apparatus 100 and the video signal processing unit 830 based on control performed by the system control unit 860.

Also in this embodiment, the output circuit of the solid-state imaging apparatus 100 is configured so as to make the parasitic capacitance Cp small, and can accordingly output a signal at high speed to the video signal processing unit 830 while reducing the deterioration of the signal gain.

Other Embodiments

The present invention is applicable to a wide range of solid-state imaging apparatus in which a coupling capacitor connects an output of the first-stage amplifier and an input of the second-stage amplifier, but is not limited to solid-state imaging apparatus and imaging systems. The source follower transistors of the first-stage amplifier and the second-stage amplifier can be n-type and p-type both, and may be replaced by voltage followers that use differential amplifiers. The first-stage amplifier and the second-stage amplifier are not limited to current amplifiers and may instead be voltage amplifiers.

The effect of reducing the parasitic capacitance Cp is obtained also when the first metal member is arranged in one direction out of above, below, to the left of, and to the right of the second metal member. For example, in FIG. 6, the two first metal members N1-3 in the third metal wiring layer Mt3 may be replaced by a GND layer to remove the vias 161 and 162 and form the first metal member N1-2 only below the second metal member.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-167227, filed Aug. 20, 2014, which is hereby incorporated by reference herein in its entirety.

What is claimed is:

1. A solid-state imaging apparatus, comprising:
   a first amplifier and a second amplifier;
   a capacitor comprising a first electrode and a second electrode;
   a first metal member, arranged over a surface of a semiconductor substrate, configured to connect an output terminal of the first amplifier and the first electrode; and
   a second metal member configured to connect an input terminal of the second amplifier and the second electrode,
   wherein the second electrode comprises polysilicon, and
   wherein, in a cross section perpendicular to the surface of the semiconductor substrate, a first part of the first metal member and a part of the second metal member are adjacent to each other in at least a first direction, and a second part of the first metal member and the part of the second metal member are adjacent to each other in a second direction which is different from the first direction.

2. A solid-state imaging apparatus according to claim 1, wherein the output terminal of the first amplifier comprises a source of a first source follower transistor, and the input terminal of the second amplifier comprises a gate of a second source follower transistor.

3. A solid-state imaging apparatus according to claim 1, wherein, in the cross section, a third part of the first metal member and the part of the second metal member are adjacent to each other in a third direction which is different from the first direction and the second direction,
   wherein the second direction crosses the first direction and the third direction.

4. A solid-state imaging apparatus according to claim 3, wherein, in the cross section, a fourth part of the first metal member and the part of the second metal member are adjacent to each other in a fourth direction which is different from the first direction, the second direction, and the third direction, and
   wherein the fourth direction crosses the first direction and the third direction.

5. A solid-state imaging apparatus according to claim 1, wherein, in the cross section, the second metal member is surrounded by the first metal member and a via.

6. A solid-state imaging apparatus according to claim 1, further comprising a plurality of pixels, each of which comprises a photoelectric conversion unit and an amplifying transistor, the photoelectric conversion unit being configured to generate an electric charge that is based on light, and the amplifying transistor being configured to output a signal that is based on the electric charge,
   wherein the first amplifier comprises the amplifying transistor.

7. An imaging system, comprising:
   a solid-state imaging apparatus according to claim 1; and a signal processing unit configured to process a signal that is output from the solid-state image pickup apparatus.

8. A solid-state imaging apparatus according to claim 1, wherein the first direction crosses the second direction.

9. A solid-state imaging apparatus according to claim 1, wherein the first metal member is connected to the first amplifier through a transistor.

10. A solid-state imaging apparatus according to claim 1, further comprising a column reading circuit configured to be input a signal from a pixel,
wherein the column reading circuit comprises the capacitor and the second amplifying circuit.

11. A solid-state imaging apparatus according to claim 1, wherein the first electrode comprises a semiconductor region of the semiconductor substrate.

12. A solid-state imaging apparatus, comprising:
a first amplifier and a second amplifier;
a capacitor comprising a first electrode and a second electrode;
a first metal member, arranged over a surface of a semiconductor substrate, configured to connect an output terminal of the first amplifier and the first electrode; and
a second metal member, arranged over the surface of the semiconductor substrate, configured to connect an input terminal of the second amplifier and the second electrode,
wherein the second electrode comprises polysilicon, and
wherein, in a planar view, a part of the second metal member is arranged between a first part of the first metal member and a second part of the first metal member.

13. A solid-state imaging apparatus according to claim 12, wherein the output terminal of the first amplifier comprises a source of a first source follower transistor, and the input terminal of the second amplifier comprises a gate of a second source follower transistor.

14. A solid-state imaging apparatus according to claim 12, wherein, in a cross section perpendicular to the surface of the semiconductor substrate, the first part of the first metal member and the part of the second metal member are adjacent to each other in a first direction, and the second part of the first metal member and the part of the second metal member are adjacent to each other in a second direction which is opposite to the first direction,
wherein, in the cross section, a third part of the first metal member and the part of the second metal member are adjacent to each other in a third direction which is different from the first direction and the second direction, and
wherein the third direction crosses the first direction and the second direction.

15. A solid-state imaging apparatus according to claim 14, wherein, in the cross section, a fourth part of the first metal member and the part of the second metal member are adjacent to each other in a fourth direction which is different from the first direction, the second direction, and the third direction, and is opposite to the third direction.

16. A solid-state imaging apparatus according to claim 12, wherein, in a cross section, the part of the second metal member is surrounded by the first metal member and a via.

17. A solid-state imaging apparatus according to claim 12, further comprising a plurality of pixels, each of which comprises a photoelectric conversion unit and an amplifying transistor, the photoelectric conversion unit being configured to generate an electric charge that is based on light, and the amplifying transistor being configured to output a signal that is based on the electric charge,
wherein the first amplifier comprises the amplifying transistor.

18. An imaging system, comprising:
a solid-state imaging apparatus according to claim 12; and
a signal processing unit configured to process a signal that is output from the solid-state image pickup apparatus.

19. A solid-state imaging apparatus according to claim 12, wherein the first metal member is connected to the first amplifier through a transistor.

20. A solid-state imaging apparatus according to claim 12, further comprising a column reading circuit configured to be input a signal from a pixel,
wherein the column reading circuit comprises the capacitor and the second amplifying circuit.

21. A solid-state imaging apparatus according to claim 12, wherein the first electrode comprises a semiconductor region of the semiconductor substrate.

* * * * *